United States Patent
Oga et al.

(10) Patent No.: US 6,645,792 B2
(45) Date of Patent: Nov. 11, 2003

(54) LEAD FRAME AND METHOD FOR FABRICATING RESIN-ENCAPSULATED SEMICONDUCTOR DEVICE

(75) Inventors: Akira Oga, Otsu (JP); Hisaho Inao, Arai (JP); Hiroshi Hidaka, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/011,704

(22) Filed: Dec. 11, 2001

(65) Prior Publication Data

US 2003/0003628 A1 Jan. 2, 2003

(30) Foreign Application Priority Data

Jun. 27, 2001 (JP) ......................................... 2001-194365

(51) Int. Cl.[7] .......................... H01L 21/44; H01L 21/48; H01L 21/50
(52) U.S. Cl. ...................... 438/123; 438/111; 438/112; 438/118; 438/124
(58) Field of Search .................... 438/111–112, 676, 438/114, 118–119, 123–127, 106; 257/666–671, 676–677; 264/272.17

(56) References Cited

U.S. PATENT DOCUMENTS

| 5,462,624 A | * | 10/1995 | Kwon |
| 5,914,531 A | * | 6/1999 | Tsunoda et al. |
| 5,977,615 A | * | 11/1999 | Yamaguchi et al. |
| 6,338,813 B1 | * | 1/2002 | Hsu et al. |
| 6,400,004 B1 | * | 6/2002 | Fan et al. |

FOREIGN PATENT DOCUMENTS

| JP | 3-152964 | | 6/1991 |
| JP | 7-14965 | | 1/1995 |
| JP | 10-72057 | * | 3/1998 |
| JP | 11-16930 | | 1/1999 |
| JP | 11-274195 | | 10/1999 |
| JP | 2001-267482 | | 9/2001 |

* cited by examiner

*Primary Examiner*—Wael Fahmy
*Assistant Examiner*—DiLinh Nguyen
(74) *Attorney, Agent, or Firm*—Nixon Peabody LLP; Donald R. Studebaker

(57) ABSTRACT

The lead frame of the present invention is a lead frame used in resin encapsulation of a semiconductor chip using an encapsulation mold that includes a die cavity to be filled with an encapsulation resin, the lead frame including: a first region exposed to the die cavity; a second region that is surrounding the first region and to be clamped by the encapsulation mold; a third region exposed to an ambient air with the die cavity being filled with the encapsulation resin; and at least one groove formed on a surface of the lead frame that is opposite to another surface of the lead frame on which the first region is present, the at least one groove extending from an area corresponding to the first region across another area corresponding to the second region so as to reach the third region.

6 Claims, 8 Drawing Sheets

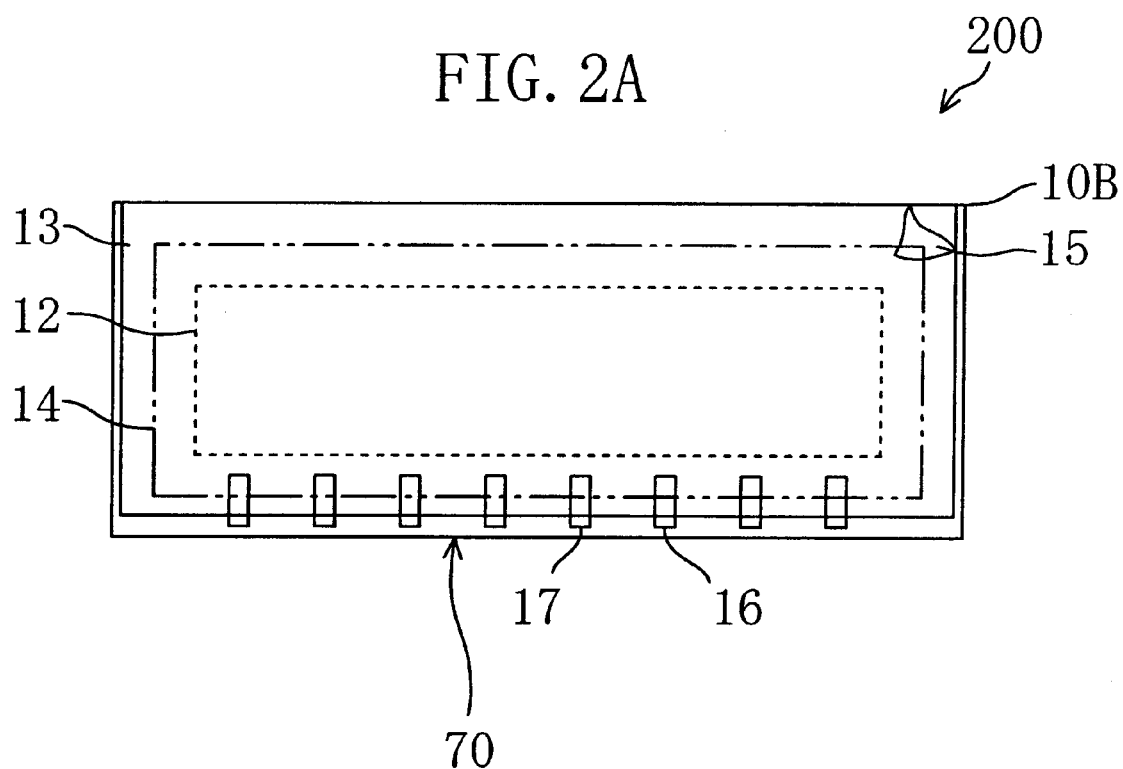
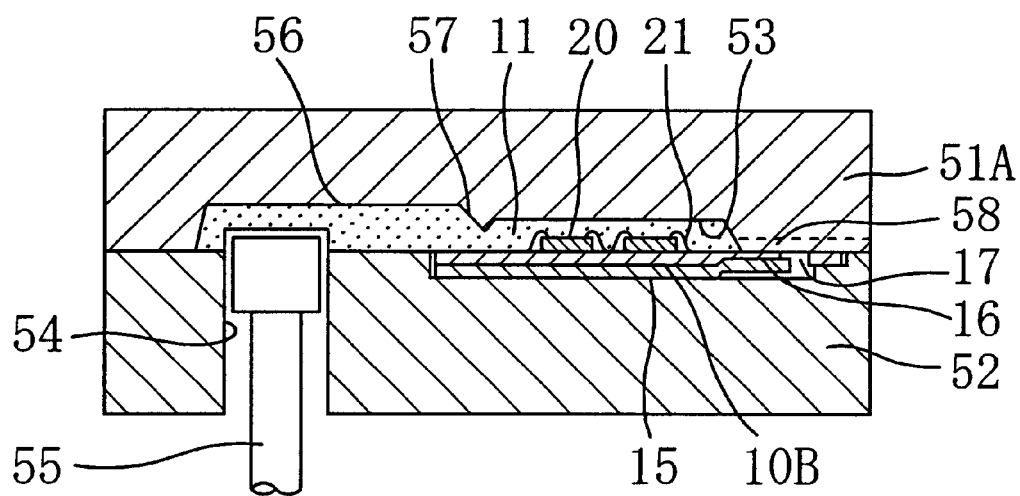

LEAD FRAME AND METHOD FOR FABRICATING RESIN-ENCAPSULATED SEMICONDUCTOR DEVICE

BACKGROUND OF THE INVENTION

The present invention relates to a method for fabricating a resin-encapsulated semiconductor device using a surface-mounted lead frame in which leads are exposed on the bottom surface of a resin-encapsulated portion (package).

In recent years, there is an increasing demand for high-density mounting of semiconductor elements on electronic devices in order to realize smaller electronic devices with higher functionalities. Accordingly, the overall size and the thickness of a semiconductor element such as a resin-encapsulated semiconductor device (a device obtained by integrally encapsulating a semiconductor chip and leads in an encapsulation resin) have been quickly reduced. Therefore, various techniques have been developed for the fabrication of semiconductor elements such as resin-encapsulated semiconductor devices in order to reduce the production cost and to increase the productivity. For example, a molding method has been developed in the art, in which a plurality of semiconductor chips are individually encapsulated in an encapsulation resin after the die bonding step and the wire bonding step. A process of resin encapsulation according to a conventional molding method will now be described with reference to FIG. 7A to FIG. 7C, FIG. 8A and FIG. 8B.

FIG. 7A to FIG. 7C are perspective views schematically illustrating a resin encapsulation apparatus used in a conventional molding method and a process of resin encapsulation with such an apparatus. FIG. 8A and FIG. 8B are cross-sectional views illustrating the inside of an encapsulation mold set during the resin encapsulation process.

As illustrated in FIG. 7A, the resin encapsulation apparatus is capable of holding an encapsulation tape 1015 under a constant tension.

As illustrated in FIG. 7B, a lead frame 1000 carrying a number of semiconductor chips thereon is set on a lower mold 1052, and resin tablets 1062 are placed in encapsulation resin supply sections 1061 of the lower mold 1052.

Then, as illustrated in FIG. 8A, the lead frame 1000 is clamped between an upper mold 1051 and the lower mold 1052. At this time, a melted encapsulation resin is supplied by a plunger 1058 from below into semiconductor product molding sections 1060, whereby a resin-encapsulated semiconductor device 1055 is injection-molded in each die cavity. Upon completing the injection molding and opening the lower mold 1052, the encapsulation tape 1015 is separated from a resin cull 1063 and the resin-encapsulated semiconductor device 1055 illustrated in FIG. 7C.

However, in the conventional molding method, when the lead frame 1000 is clamped between the upper mold 1051 and the lower mold 1052, a gas (e.g., an air left therein due to warping of the lead frame 1000, etc., a vapor generated from the encapsulation tape 1015 due to a temperature increase, or an organic material gas) may be entrapped in the slight gap between the encapsulation tape 1015 and the opposing upper mold 1051. If the lead frame 1000 is clamped between the upper mold 1051 and the lower mold 1052 with such a gas being entrapped, the gas will not be discharged out of the gap between the upper and lower molds. Moreover, subsequent injection of an encapsulation resin into the cavity may push the entrapped gas away from a resin injection gate 1070, as illustrated in FIG. 8B, thereby deforming the lead frame 1000 by the pressure of the gas being pushed. An excessive deformation of the lead frame 1000 may cause a semiconductor chip 1021 and/or a thin metal wire 1022 to come into contact with the lower mold 1052, thereby damaging or deforming the semiconductor chip 1021 and/or the thin metal wire 1022.

SUMMARY OF THE INVENTION

The present invention has been made in order to solve this problem in the prior art, and has an object to suppress the deformation of a lead frame during the resin encapsulation step.

A lead frame of the present invention is a lead frame used in resin encapsulation of a semiconductor chip using an encapsulation mold that includes a die cavity to be filled with an encapsulation resin, the lead frame including: a first region exposed to the die cavity; a second region that is surrounding the first region and to be clamped by the encapsulation mold; a third region exposed to an ambient air with the die cavity being filled with the encapsulation resin; and at least one groove formed on a surface of the lead frame that is opposite to another surface of the lead frame on which the first region is present, the at least one groove extending from an area corresponding to the first region across another area corresponding to the second region so as to reach the third region.

When a resin-encapsulated semiconductor device is fabricated with a resin creepage preventing member being attached to one surface of the lead frame of the present invention that is opposite to the surface thereof on which the first region is present, the air entrapped between the resin creepage preventing member and the encapsulation mold is pushed into the second region clamped by the encapsulation mold due to the pressure from the resin being injected into the die cavity in the resin encapsulation process. The air being pushed lifts the resin creepage preventing member covering at least one groove toward the lead frame, i.e., into the at least one groove. The at least one groove extends from an area corresponding to the first region across another area corresponding to the second region so as to reach the third region that is exposed to the ambient air, whereby the air lifting the resin creepage preventing member into the at least one groove is discharged to the outside of the encapsulation mold. Therefore, in the fabrication of a resin-encapsulated semiconductor device, it is possible to suppress/prevent the lead frame from being deformed, and to suppress/prevent a damage to semiconductor chips, a deformation and disruption of thin metal wires, etc., which may otherwise occur due to the deformation of the lead frame.

The at least one groove may be a U-shaped groove; and the third region may be a side edge of the lead frame surrounding the second region.

The at least one groove may be a U-shaped groove that includes a through hole connecting the at least one groove to the third region.

A method for fabricating a resin-encapsulated semiconductor device of the present invention includes the steps of: (a) preparing a lead frame, including: a first region; a second region surrounding the first region; a third region located outside the second region; and at least one groove formed on a surface of the lead frame that is opposite to another surface of the lead frame on which the first region is present, the at least one groove extending from an area corresponding to the first region across another area corresponding to the second region so as to reach the third region; (b) providing a resin creepage preventing member on the area corresponding to the first region; (c) mounting a semiconductor chip on the first region of the lead frame; and (d) clamping the second region by an encapsulation mold that includes a die cavity so as to place the semiconductor chip into the die cavity, and filling the die cavity with a resin.

With this fabrication method, in the resin filling step, the air entrapped between the resin creepage preventing member and the encapsulation mold is pushed into the second region clamped by the encapsulation mold due to the pressure from the resin being injected into the die cavity. The air being pushed lifts the resin creepage preventing member covering at least one groove toward the lead frame, i.e., into the at least one groove. The at least one groove extends from an area corresponding to the first region across another area corresponding to the second region so as to reach the third region that is located outside the second region and is not clamped by the encapsulation mold, whereby the air lifting the resin creepage preventing member into the at least one groove is discharged to the outside of the encapsulation mold. Therefore, in the fabrication of a resin-encapsulated semiconductor device, it is possible to suppress/prevent the lead frame from being deformed, and to suppress/prevent a damage to semiconductor chips, a deformation and disruption of thin metal wires, etc., which may otherwise occur due to the deformation of the lead frame.

In the step (a), the at least one groove may be a U-shaped groove; and the third region may be a side edge surrounding the second region.

In the step (a), the at least one groove may be a U-shaped groove that includes a through hole connecting the at least one groove to the third region.

In the step (b), the resin creepage preventing member is preferably provided along a surface of the at least one groove.

In this way, the air that has been pushed into the second region clamped by the encapsulation mold in the resin encapsulation process is discharged to the outside of the encapsulation mold, whereby the pressure for lifting the resin creepage preventing member covering the at least one groove toward the lead frame, i.e., into the at least one groove, is not required. Therefore, the air discharging efficiency is improved.

Another method for fabricating a resin-encapsulated semiconductor device of the present invention includes the steps of: (a) preparing a lead frame including a first region and a second region surrounding the first region; (b) providing a resin creepage preventing member on an area corresponding to the first region and another area corresponding to the second region, the resin creepage preventing member including at least one U-shaped groove extending from a position corresponding to the first region across the area corresponding to the second region so as to reach a side edge surrounding the second region; (c) mounting a semiconductor chip on the first region of the lead frame; and (d) clamping the second region by an encapsulation mold that includes a die cavity so as to place the semiconductor chip into the die cavity, and filling the die cavity with a resin.

With this fabrication method, in the resin filling step, the air entrapped between the resin creepage preventing member and the encapsulation mold is pushed into the second region clamped by the encapsulation mold due to the pressure from the resin being injected into the die cavity. The air being pushed is discharged to the outside of the encapsulation mold through at least one groove that is provided in the resin creepage preventing member and extends from an area corresponding to the first region across another area corresponding to the second region so as to reach a side edge that is surrounding the second region and is not clamped by the encapsulation mold. Therefore, in the fabrication of a resin-encapsulated semiconductor device, it is possible to suppress/prevent the lead frame from being deformed, and to suppress/prevent a damage to semiconductor chips, a deformation and disruption of thin metal wires, etc., which may otherwise occur due to the deformation of the lead frame.

Still another method for fabricating a resin-encapsulated semiconductor device of the present invention includes the steps of: (a) preparing a lead frame including a first region and a second region surrounding the first region; (b) providing a resin creepage preventing member on an area corresponding to the first region and another area corresponding to the second region, the resin creepage preventing member including a satin finished surface on the area corresponding to the first region and the area corresponding to the second region; (c) mounting a semiconductor chip on the first region; and (d) clamping the second region by an encapsulation mold that includes a die cavity so as to place the semiconductor chip into the die cavity, and filling the die cavity with a resin.

With this fabrication method, in the resin filling step, the air entrapped between the resin creepage preventing member and the encapsulation mold is moved by the pressure from the resin being injected into the die cavity through spaces between the minute surface irregularities of the satin finished surface of the resin creepage preventing member, and is discharged to the outside of the encapsulation mold before the lead frame is deformed. Therefore, in the fabrication of a resin-encapsulated semiconductor device, it is possible to suppress/prevent the lead frame from being deformed, and to suppress/prevent a damage to semiconductor chips, a deformation and disruption of thin metal wires, etc., which may otherwise occur due to the deformation of the lead frame.

Still another method for fabricating a resin-encapsulated semiconductor device of the present invention includes the steps of: (a) preparing a first encapsulation mold including a die cavity and a clamp section and a second encapsulation mold including a surface corresponding to the die cavity and another surface corresponding to the clamp section, the second encapsulation mold including at least one groove extending from an area corresponding to the die cavity across another area corresponding to the clamp section so as to reach still another area surrounding the area corresponding to the clamp section; (b) preparing a lead frame including a first region and a second region surrounding the first region; (c) providing a resin creepage preventing member on an area corresponding to the first region and another area corresponding to the second region; (d) mounting a semiconductor chip on the first region of the lead frame; and (e) clamping the second region by the first encapsulation mold and the second encapsulation mold so as to place the semiconductor chip into the die cavity, and filling the die cavity with a resin.

With this fabrication method, in the resin filling step, the air entrapped between the resin creepage preventing member and the second encapsulation mold is discharged to the outside of the encapsulation mold, before the lead frame is deformed, through at least one groove that is provided in the second encapsulation mold and extends from an area corresponding to the die cavity across another area corresponding to the clamp section so as to reach still another area surrounding the area corresponding to the clamp section. Therefore, in the fabrication of a resin-encapsulated semiconductor device, it is possible to suppress/prevent the lead frame from being deformed, and to suppress/prevent a damage to semiconductor chips, a deformation and disruption of thin metal wires, etc., which may otherwise occur due to the deformation of the lead frame.

Still another method for fabricating a resin-encapsulated semiconductor device of the present invention includes the steps of: preparing a first encapsulation mold including a die cavity and a clamp section and a second encapsulation mold including a surface corresponding to the die cavity and another surface corresponding to the clamp section, the surface corresponding to the die cavity and the surface corresponding to the clamp section being satin finished; (b) preparing a lead frame including a first region and a second region surrounding the first region; (c) providing a resin creepage preventing member on an area corresponding to the first region and another area corresponding to the second region; (d) mounting a semiconductor chip on the first region of the lead frame; and (e) clamping the second region by the first encapsulation mold and the second encapsulation mold so as to place the semiconductor chip into the die cavity, and filling the die cavity with a resin.

With this fabrication method, in the resin filling step, air entrapped between the resin creepage preventing member and the encapsulation mold is moved by the pressure from the resin being injected into the die cavity through spaces between the minute surface irregularities of the satin finished surface of the second encapsulation mold, and is discharged to the outside of the encapsulation mold before the lead frame is deformed. Therefore, in the fabrication of a resin-encapsulated semiconductor device, it is possible to suppress/prevent the lead frame from being deformed, and to suppress/prevent a damage to semiconductor chips, a deformation and disruption of thin metal wires, etc., which may otherwise occur due to the deformation of the lead frame.

BRIEF DESCRIPTION OF THE DRAWINGS

FIG. 2A is a diagram schematically illustrating an encapsulation tape/lead frame according to Embodiment 2 of the present invention, and FIG. 2B is a cross-sectional view illustrating a method for fabricating a semiconductor device according to Embodiment 2 of the present invention.

DETAILED DESCRIPTION OF THE PREFERRED EMBODIMENTS

Figure 1A:
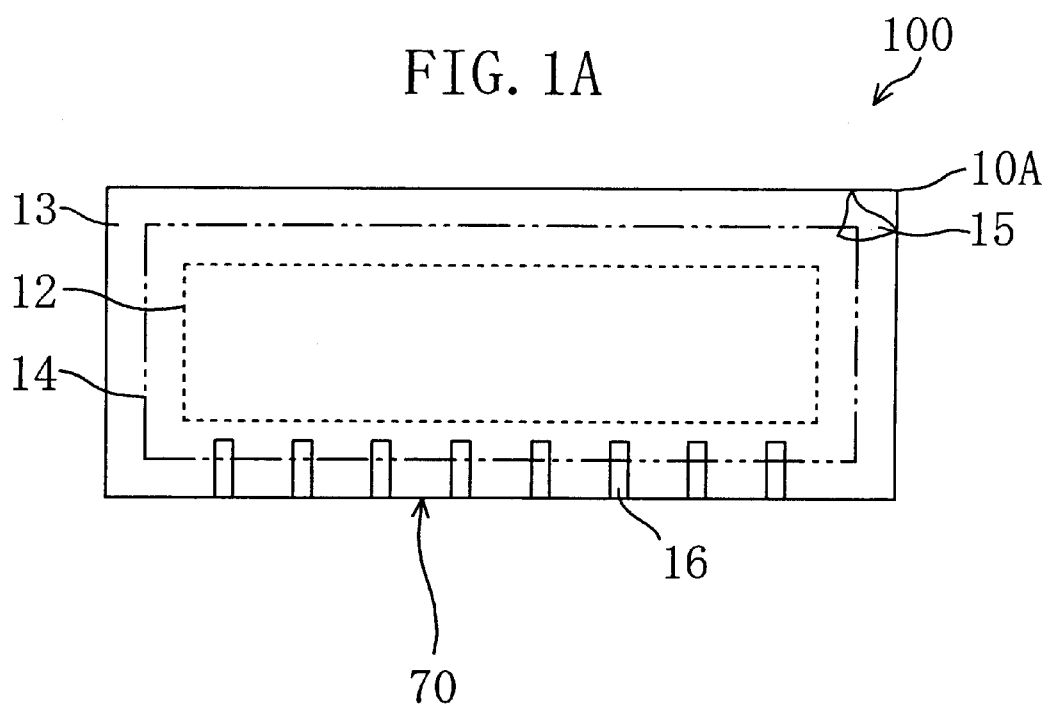
FIG. 1A is a diagram schematically illustrating an encapsulation tape/lead frame according to Embodiment 1 of the present invention.

Embodiments of the present invention will now be described with reference to the drawings, in which like members are denoted by like reference numerals for the sake of simplicity.

Embodiment 1

Embodiment 1 of the present invention will now be described with reference to FIG. 1A and FIG. 1B.

Figure 1B:
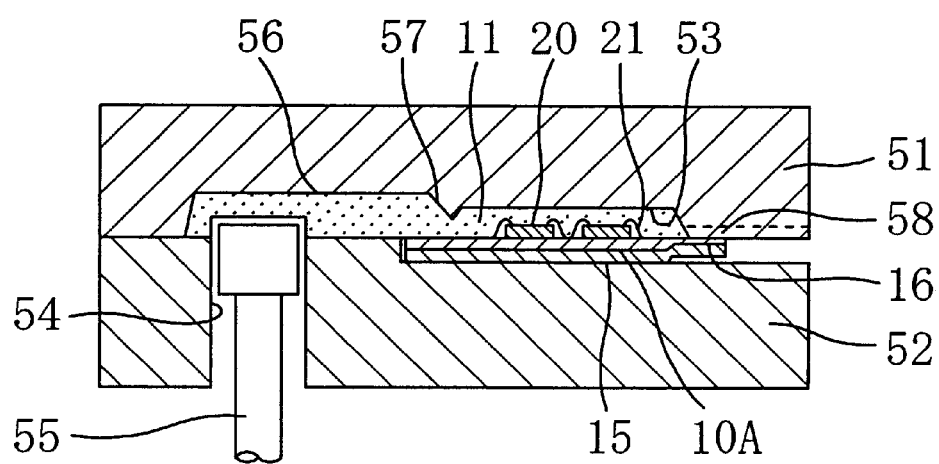
FIG. 1B is a cross-sectional view illustrating a method for fabricating a semiconductor device according to Embodiment 1 of the present invention.

FIG. 1A is a diagram schematically illustrating an encapsulation tape/lead frame 100 of the present embodiment, and FIG. 1B is a cross-sectional view illustrating a method for fabricating a semiconductor device of the present embodiment. The term "encapsulation tape/lead frame" as used herein refers to a lead frame with an encapsulation tape adhered thereto.

The encapsulation tape/lead frame 100 of the present embodiment includes a lead frame 10A and an encapsulation tape 15 adhered thereto.

As illustrated in FIG. 1A, the lead frame 10A includes, in its central area, a semiconductor device formation region 12, in which a plurality of semiconductor chips are to be resin-encapsulated in a single process. The periphery of the semiconductor device formation region 12 is connected to and supported by an outer frame 13. An area in the outer frame 13 that is defined within a mold line 14 is an area to be encapsulated by an encapsulation resin in a single process, and an area outside the mold line 14 is an area to be clamped by the mold set.

The bottom surface of the lead frame 10A includes a plurality of U-shaped grooves 16 (the term "U-shaped groove" as used herein refers to a groove having a bottom surface, as opposed to a through hole having no bottom surface) each extending transversely across the mold line 14 from a position inside the mold line 14 toward a side edge 70 of the lead frame 10A.

The encapsulation tape 15 is attached across the entirety of one surface (bottom surface) of the lead frame 10A that is opposite to the semiconductor chip holding surface thereof. The encapsulation tape 15 is provided so as to prevent an encapsulation resin from creeping onto the bottom surface side of the lead frame 10A in the resin encapsulation step.

A method for fabricating a semiconductor device of the present embodiment will now be described.

First, the encapsulation tape 15 is attached across the entirety of the bottom surface of the lead frame 10A. In the present embodiment, leads are exposed on one surface (bottom surface) of the lead frame 10A opposite to the surface thereof holding semiconductor chips 20 (i.e., the lead frame 10A is of a surface-mounted type). Therefore, the encapsulation tape 15 is attached across the entirety of the bottom surface of the lead frame 10A so as to prevent an encapsulation resin 11 from creeping onto the bottom surface of the lead frame 10A. While the encapsulation tape 15 is attached across the entirety of the bottom surface of the lead frame 10A in the present embodiment, the manner in which the encapsulation tape 15 is attached is not limited thereto as long as it covers at least the area defined within the mold line 14. The attachment of the encapsulation tape 15 may be done at any timing before the subsequent resin encapsulation step.

Then, in a die bonding step, the semiconductor chips 20 are fixed to respective die pads (not shown) of the lead frame 10A via a solder, or the like.

Then, in a wire bonding step, each semiconductor chip 20 is electrically connected to leads (not shown) of the lead frame 10A via thin metal wires 21 made of gold (Au), for example.

Then, a resin encapsulation process is performed so as to produce a resin-encapsulated semiconductor device by injection molding.

The resin encapsulation step of the present embodiment will now be described in greater detail.

A semiconductor device fabrication apparatus used in the resin encapsulation step of the present embodiment includes an upper mold 51 and a lower mold 52, as illustrated in FIG. 1B.

The lower mold 52 includes a pot section 54 for introducing an encapsulation resin therethrough, and a plunger 55 that can be moved up and down in the pot section 54.

The upper mold 51 includes a cavity 53 (defined by a depressed portion of the upper mold 51) that is used for resin-encapsulating the semiconductor chips 20 fixed to the single encapsulation tape/lead frame 100 in a single process and that dictates the shape of the molded product. The upper mold 51 further includes a runner 56 and a gate 57 via which the encapsulation resin 11 is supplied into the cavity 53, and an air vent 58 for discharging the air from the cavity 53 out of the mold set. The air vent 58 is provided at one end that is opposite to the gate 57 with respect to the cavity 53.

Referring to FIG. 1B, the resin encapsulation step is performed as follows. First, the encapsulation tape/lead frame 100 with the semiconductor chips 20 fixed thereto is set on the lower mold 52 so that the bottom surface of the encapsulation tape/lead frame 100 carrying the encapsulation tape 15 attached thereto faces the upper surface of the lower mold 52.

Then, the encapsulation tape/lead frame 100 is clamped between the upper mold 51 and the lower mold 52. In this process, it is difficult to bring the encapsulation tape 15 of the encapsulation tape/lead frame 100 into a perfect contact with the upper surface of the lower mold 52 while maintaining the encapsulation tape/lead frame 100 in a completely flat configuration. It is often the case that an air is entrapped in the slight gap between the encapsulation tape 15 and the upper surface of the lower mold 52.

Then, the encapsulation resin 11, which has been heated and thus given a flowability, is injected into the cavity 53 by the plunger 55, thereby encapsulating the semiconductor chips 20 in a single process.

In the present embodiment, when the encapsulation resin 11 is injected into the cavity 53, the air entrapped in the slight gap between the encapsulation tape 15 and the lower mold 52 is moved toward the air vent 58 by the pressure from the injection of the encapsulation resin 11. As the injection of the encapsulation resin 11 into the cavity 53 proceeds, the air entrapped between the encapsulation tape 15 and the lower mold 52 is discharged to the outside while lifting, by virtue of its own pressure, the encapsulation tape 15 covering the grooves 16 toward the lead frame 10A (i.e., into the grooves 16).

In this way, it is possible to prevent the lead frame 10A from being deformed, and to suppress/prevent a damage to the semiconductor chips 20, a deformation and disruption of the thin metal wires 21, etc., which may otherwise occur due to the deformation of the lead frame 10A. Thus, it is possible to obtain a resin-encapsulated semiconductor device with a high yield, and to reduce the fabrication cost.

Each of the grooves 16 needs to be formed on the bottom surface of the lead frame 10A so as to extend at least from a position inside the mold line 14 across the peripheral portion that is clamped by the mold set to reach an area that is exposed to the ambient air. Particularly, when the outer frame 13 located outside the mold line 14 is entirely clamped between the upper mold 51 and the lower mold 52, the air discharging effect is obtained by forming the grooves 16 to reach the side edge 70 of the lead frame 10A. While the grooves 16 are U-shaped grooves having a bottom surface in the present embodiment, effects as those described above can also be obtained by employing cut-through grooves (the term "cut-through groove" as used herein refers to a through hole having no bottom surface). Alternatively, the grooves 16 may each be partially cut through and partially U-shaped with the U-shaped portion being located in the clamped area, in which case it is possible to prevent the encapsulation resin 11 from leaking out from the cavity 53 through the groove 16 in the encapsulation step.

The encapsulation tape 15 may be attached to the bottom surface of the lead frame 10A so that the encapsulation tape 15 is bent into a concave shape along each groove 16 provided on the bottom surface. In this way, when the encapsulation resin 11 is injected into the cavity 53, the air can be discharged without lifting the encapsulation tape 15 toward the lead frame 10A. Therefore, it is possible to more efficiently prevent the deformation of the lead frame 10A.

Embodiment 2

Embodiment 2 of the present invention will now be described with reference to FIG. 2A and FIG. 2B.

FIG. 2A is a diagram schematically illustrating an encapsulation tape/lead frame 200 of the present embodiment, and FIG. 2B is a cross-sectional view illustrating a method for fabricating a semiconductor device of the present embodiment.

The encapsulation tape/lead frame 200 of the present embodiment includes a lead frame 10B and the encapsulation tape 15 adhered thereto.

As illustrated in FIG. 2A, the lead frame 10B of the present embodiment includes, in its central area, the semiconductor device formation region 12, in which a plurality of semiconductor chips are to be resin-encapsulated in a single process. The periphery of the semiconductor device formation region 12 is connected to and supported by the outer frame 13. An area in the outer frame 13 that is defined within the mold line 14 is an area to be encapsulated by an encapsulation resin in a single process, and an area outside the mold line 14 is an area to be clamped by the mold set.

The outer frame 13 of the lead frame 10B includes a plurality of U-shaped grooves 16 each extending transversely across the mold line 14 from a position inside the mold line 14 toward the side edge 70 of the lead frame 10B. One end of each U-shaped groove 16 that is closer to the side edge 70 of the lead frame 10B is connected to a through hole 17.

The encapsulation tape 15 is attached to one surface (bottom surface) of the lead frame 10B that is opposite to the semiconductor chip holding surface thereof. Particularly, in the present embodiment, the encapsulation tape 15 is attached so as to cover at least an area of the bottom surface of the lead frame 10B that is defined within the mold line 14 while exposing at least a portion of each through hole 17.

A method for fabricating a semiconductor device of the present embodiment will now be described.

In the method for fabricating a semiconductor device of the present embodiment, the die bonding step and the wire bonding step are as described above in Embodiment 1.

In the present embodiment, the step of attaching the encapsulation tape 15 to the bottom surface of the lead frame 10B is performed so that the encapsulation tape 15 covers an area of the bottom surface that is defined within the mold line 14 while exposing at least a portion of each through hole 17. The encapsulation tape 15 may be attached in any manner as long as it covers at least an area of the bottom surface of the lead frame 10B that is defined within the mold line 14. Moreover, the attachment of the encapsulation tape 15 may be done at any timing before the subsequent resin encapsulation step.

Then, a resin encapsulation process is performed so as to produce a resin-encapsulated semiconductor device by injection molding.

The resin encapsulation step of the present embodiment will now be described in greater detail.

A semiconductor device fabrication apparatus used in the resin encapsulation step of the present embodiment includes an upper mold 51A and a lower mold 52A, as illustrated in FIG. 2B.

The lower mold 52A includes the pot section 54 for introducing an encapsulation resin therethrough, and the plunger 55 that can be moved up and down in the pot section 54. The mold set has a configuration such that it encloses therein the side edge 70 of the lead frame 10B, as illustrated in FIG. 2B.

The upper mold 51A includes the cavity 53 (defined by a depressed portion of the upper mold 51A) that is used for resin-encapsulating the semiconductor chips 20 fixed to the single lead frame 10B in a single process and that dictates the shape of the molded product. The upper mold 51A further includes the runner 56 and the gate 57 via which the encapsulation resin 11 is supplied into the cavity 53, and the air vent 58 for discharging the air from the cavity 53 out of the mold set. The air vent 58 is provided at one end that is opposite to the gate 57 with respect to the cavity 53. Particularly, in the present embodiment, the air vent 58 is provided in an area where the through hole 17 is located upon setting the encapsulation tape/lead frame 200 in the mold set.

Referring to FIG. 2B, the resin encapsulation step is performed as follows. First, the encapsulation tape/lead frame 200 with the semiconductor chips 20 fixed thereto is set on the lower mold 52A so that the bottom surface of the encapsulation tape/lead frame 200 carrying the encapsulation tape 15 attached thereto faces the upper surface of the lower mold 52A.

Then, the encapsulation tape/lead frame 200 is clamped between the upper mold 51A and the lower mold 52A. In this process, as in Embodiment 1 above, it is difficult to bring the encapsulation tape 15 of the encapsulation tape/lead frame 200 into a perfect contact with the upper surface of the lower mold 52A while maintaining the encapsulation tape/lead frame 200 in a completely flat configuration. It is often the case that an air is entrapped in the slight gap between the encapsulation tape 15 and the upper surface of the lower mold 52A.

Then, the encapsulation resin 11, which has been heated and thus given a flowability, is injected into the cavity 53 by the plunger 55, thereby encapsulating the semiconductor chips 20 in a single process.

In the present embodiment, when the encapsulation resin 11 is injected into the cavity 53, the air entrapped in the slight gap between the encapsulation tape 15 and the lower mold 52A is moved toward the air vent 58 by the pressure from the injection of the encapsulation resin 11. As the injection of the encapsulation resin 11 into the cavity 53 proceeds, the air entrapped between the encapsulation tape 15 and the lower mold 52A is moved along the grooves 16 while lifting, by virtue of its own pressure, the encapsulation tape 15 covering the grooves 16 toward the lead frame 10B. The air further passes through the through hole 17 and is then discharged through the air vent 58 of the upper mold 51A that is not involved in clamping.

According to the present embodiment, it is possible to prevent the lead frame 10B from being deformed, and to suppress/prevent a damage to the semiconductor chips 20, a deformation and disruption of the thin metal wires 21, etc., which may otherwise occur due to the deformation of the lead frame 10B. Thus, it is possible to obtain a resin-encapsulated semiconductor device with a high yield, and to reduce the fabrication cost.

Thus, the configuration of the lead frame 10B of the present embodiment is suitable for cases where the lower mold 52A having a configuration such that the mold set encloses therein the side edge 70 of the lead frame 10B, as illustrated in FIG. 2B, is used. In such cases, in order to maximize the air discharging effect, it is preferred that the encapsulation tape 15 is attached to the lead frame 10B so as to cover at least an area of the outer frame 13 including the mold line 14 while exposing the entirety of the through holes 17.

The encapsulation tape 15 may be attached to the bottom surface of the lead frame 10B so that the encapsulation tape 15 is bent into a concave shape along each groove 16 provided on the bottom surface. In this way, when the encapsulation resin 11 is injected into the cavity 53, the air can be discharged without lifting the encapsulation tape 15 toward the lead frame 10B. Therefore, it is possible to more efficiently prevent the deformation of the lead frame 10B.

Embodiment 3

Embodiment 3 of the present invention will now be described with reference to FIG. 3A and FIG. 3B.

Figure 3A:
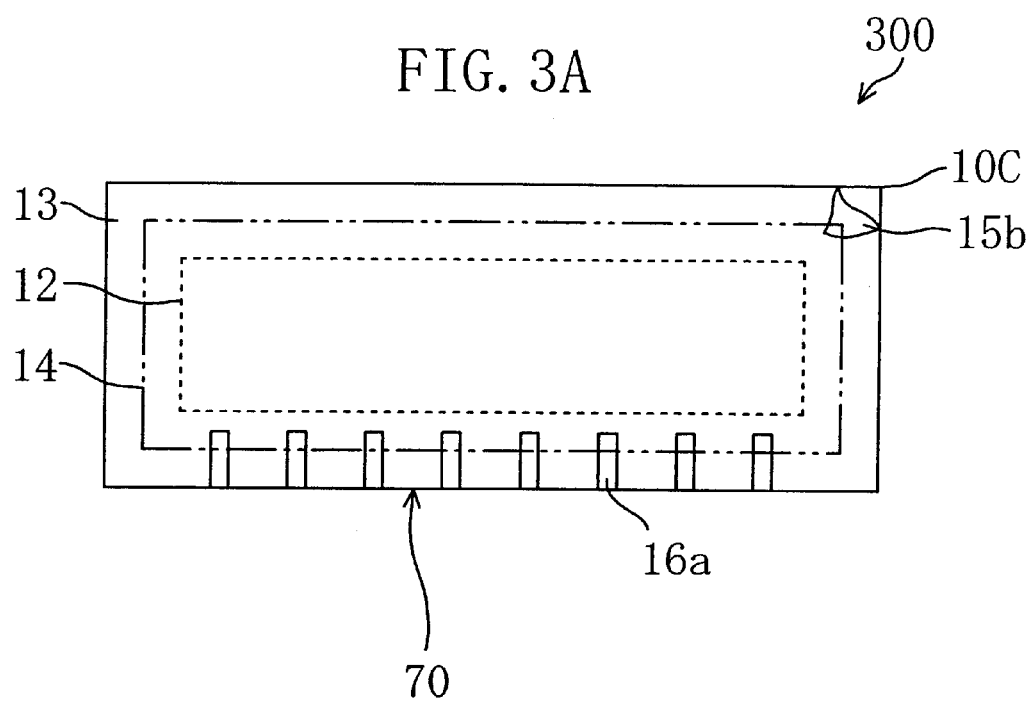
FIG. 3A is a diagram schematically illustrating an encapsulation tape/lead frame according to Embodiment 3 of the present invention.
Figure 3B:
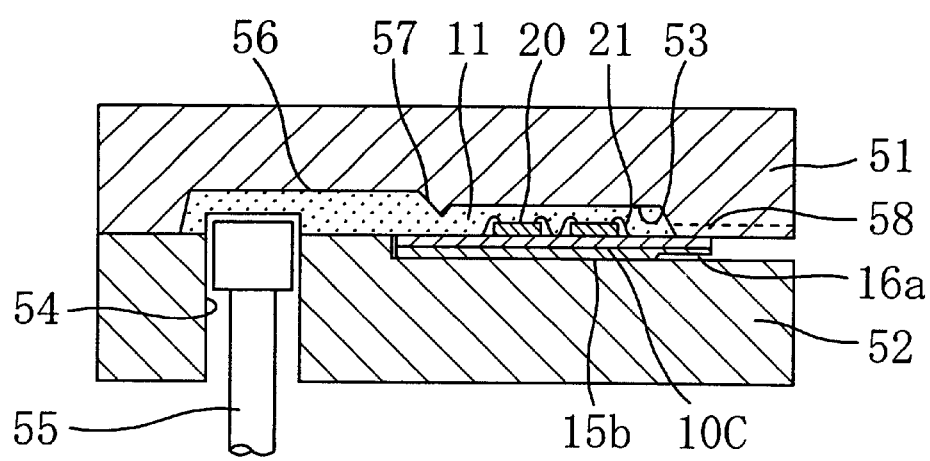
FIG. 3B is a cross-sectional view illustrating a method for fabricating a semiconductor device according to Embodiment 3 of the present invention.

FIG. 3A is a diagram schematically illustrating an encapsulation tape/lead frame 300 of the present embodiment, and FIG. 3B is a cross-sectional view illustrating a method for fabricating a semiconductor device of the present embodiment.

The encapsulation tape/lead frame 300 of the present embodiment includes a lead frame 10C and an encapsulation tape 15b adhered thereto.

As illustrated in FIG. 3A, the lead frame 10C of the present embodiment includes, in its central area, the semiconductor device formation region 12, in which a plurality of semiconductor chips are to be resin-encapsulated in a single process. The periphery of the semiconductor device formation region 12 is connected to and supported by the outer frame 13. An area in the outer frame 13 that is defined within the mold line 14 is an area to be encapsulated by an encapsulation resin in a single process, and an area outside the mold line 14 is an area to be clamped by the mold set.

The encapsulation tape 15b is attached to one surface (bottom surface) of the lead frame 10C that is opposite to the surface thereof holding the semiconductor chips 20. Particularly, in the present embodiment, the surface of the encapsulation tape 15b includes a plurality of U-shaped grooves 16a each extending transversely across the mold line 14 from a position inside the mold line 14 toward the side edge 70 of the lead frame 10C.

A method for fabricating a semiconductor device of the present embodiment will now be described.

In the method for fabricating a semiconductor device of the present embodiment, the die bonding step and the wire bonding step are as described above in Embodiment 1.

The encapsulation tape 15b is attached across the entirety of the bottom surface of the lead frame 10C so as to prevent the encapsulation resin 11 from creeping onto the bottom surface of the lead frame 10C. While the encapsulation tape 15b is attached across the entirety of the bottom surface of the lead frame 10C in the present embodiment, the manner in which the encapsulation tape 15b is attached is not limited thereto as long as it covers at least the area defined within the mold line 14. The attachment of the encapsulation tape 15b may be done at any timing before the subsequent resin encapsulation step.

Then, a resin encapsulation process is performed so as to produce a resin-encapsulated semiconductor device by injection molding. As illustrated in FIG. 3B, the same semiconductor device fabrication apparatus as in Embodiment 1 above is used in the resin encapsulation step of the present embodiment. Moreover, the resin encapsulation step is performed in the same manner as in Embodiment 1 above.

In the present embodiment, when the encapsulation resin 11 is injected into the cavity 53, the air entrapped in the slight gap between the encapsulation tape 15b and the lower mold 52 is moved toward the air vent 58 by the pressure from the injection of the encapsulation resin 11. As the injection of the encapsulation resin 11 into the cavity 53 proceeds, the air entrapped between the encapsulation tape 15b and the lower mold 52 is discharged out of the mold line 14 through the grooves 16a of the encapsulation tape 15 before the lead frame 10C is deformed.

In this way, it is possible to prevent the lead frame 10C from being deformed, and to suppress/prevent a damage to the semiconductor chips 20, a deformation and disruption of the thin metal wires 21, etc., which may otherwise occur due to the deformation of the lead frame 10C. Thus, it is possible to obtain a resin-encapsulated semiconductor device with a high yield, and to reduce the fabrication cost.

Embodiment 4

Embodiment 4 of the present invention will now be described with reference to FIG. 4A and FIG. 4B.

Figure 4A:
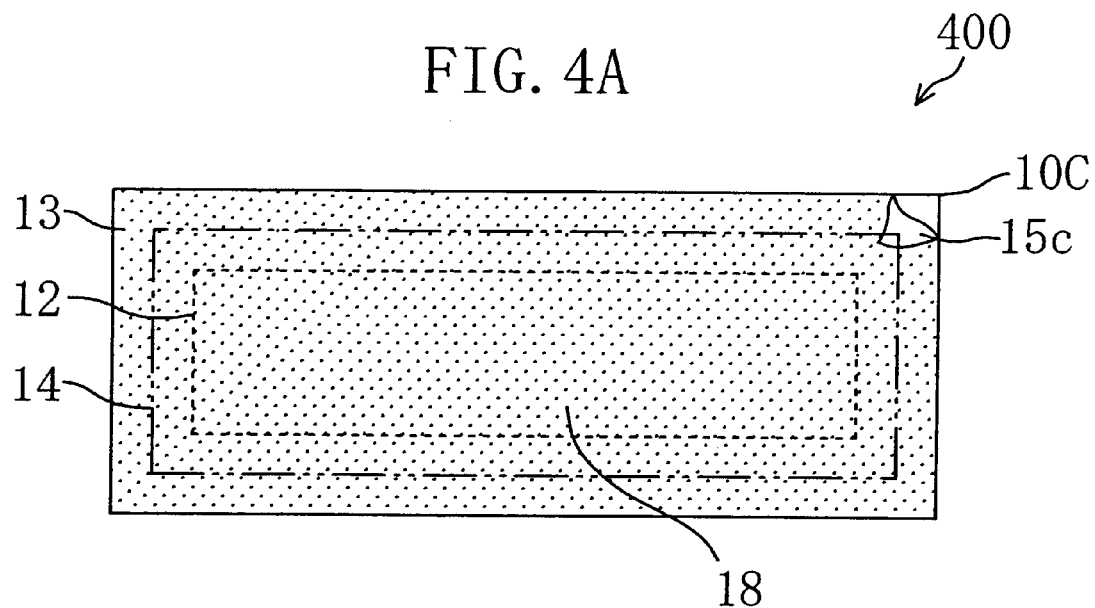
FIG. 4A is a diagram schematically illustrating an encapsulation tape/lead frame according to Embodiment 4 of the present invention.
Figure 4B:
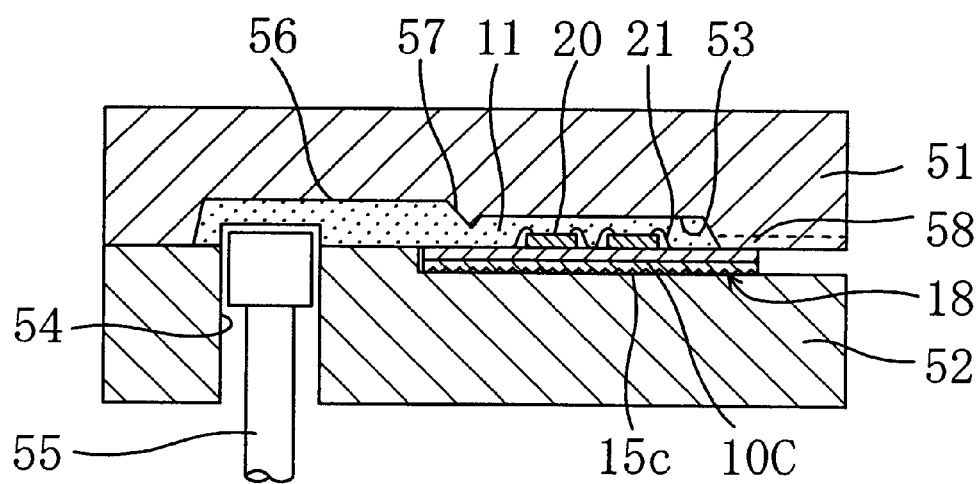
FIG. 4B is a cross-sectional view illustrating a method for fabricating a semiconductor device according to Embodiment 4 of the present invention.

FIG. 4A is a diagram schematically illustrating an encapsulation tape/lead frame 400 of the present embodiment, and FIG. 4B is a cross-sectional view illustrating a method for fabricating a semiconductor device of the present embodiment.

The encapsulation tape/lead frame 400 of the present embodiment includes the lead frame 10C and an encapsulation tape 15c adhered thereto.

As illustrated in FIG. 4A, the same lead frame 10C as in Embodiment 3 above is used in the present embodiment. The encapsulation tape 15c is attached across the entirety of one surface (bottom surface) of the lead frame 10C that is opposite to the surface thereof holding the semiconductor chips 20. Particularly, the encapsulation tape 15c of the present embodiment includes a rough surface (satin finished surface) 18 with minute surface irregularities on one side thereof that is away from the lead frame 10C.

A method for fabricating a semiconductor device of the present embodiment will now be described.

In the method for fabricating a semiconductor device of the present embodiment, the die bonding step, the wire bonding step and the resin encapsulation step are as described above in Embodiment 1.

In the present embodiment, however, the encapsulation tape 15c is attached across the entirety of the bottom surface of the lead frame 10C. The attachment of the encapsulation tape 15c may be done at any timing before the subsequent resin encapsulation step.

When the encapsulation resin 11 is injected into the cavity 53, the air entrapped in the slight gap between the encapsulation tape 15c and the upper surface of the lower mold 52 is squeezed by the pressure from the encapsulation resin 11 toward the air vent 58 through spaces between the minute surface irregularities of the satin finished surface 18 of the encapsulation tape 15c, and is discharged out of the mold line 14 before the lead frame 10C is deformed. In this way, it is possible to suppress/prevent the lead frame 10C from being deformed, and to suppress/prevent a damage to the semiconductor chips 20, a deformation and disruption of the thin metal wires 21, etc., which may otherwise occur due to the deformation of the lead frame 10C. Particularly, this effect is pronounced when the surface roughness Rz of the satin finished surface 18 is in the range of 2 to 50 μm.

Embodiment 5

Embodiment 5 of the present invention will now be described with reference to FIG. 5A and FIG. 5B.

Figure 5A:
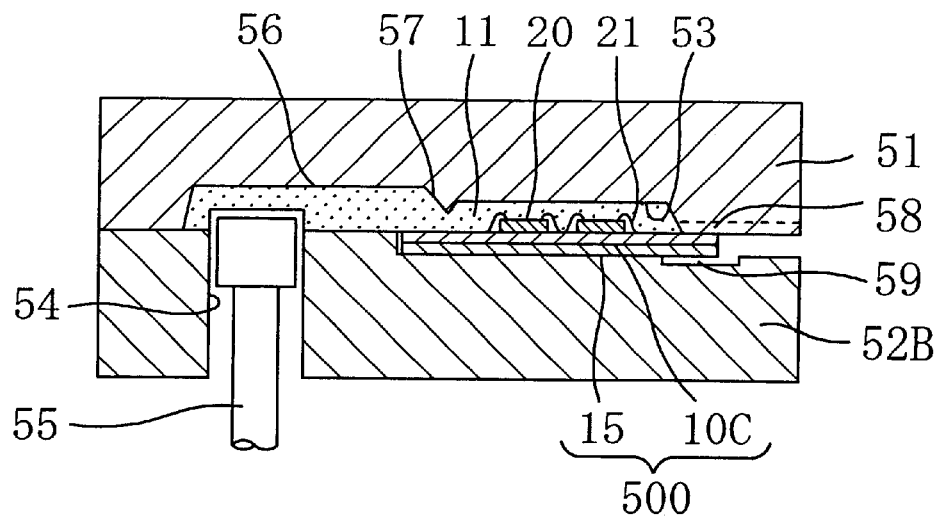
FIG. 5A is a cross-sectional view illustrating a method for fabricating a semiconductor device according to Embodiment 5 of the present invention.
Figure 5B:
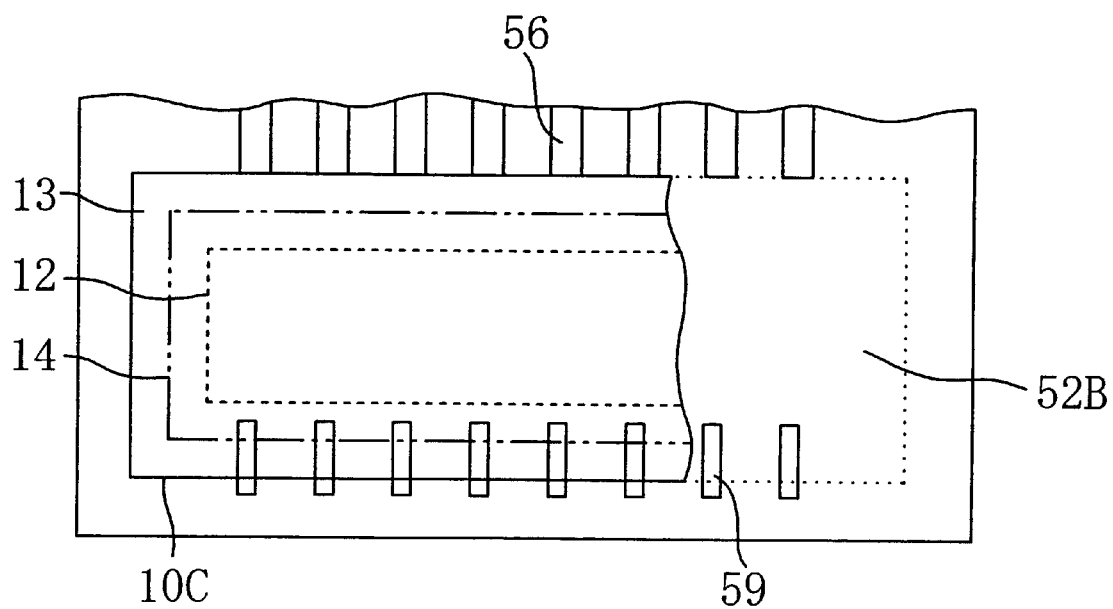
FIG. 5B is a diagram schematically illustrating an upper surface of a lower mold on which an encapsulation tape/lead frame has been set.

FIG. 5A is a cross-sectional view illustrating a method for fabricating a semiconductor device of the present embodiment, and FIG. 5B is a partially cutaway view schematically illustrating an upper surface of a lower mold 52B on which an encapsulation tape/lead frame 500 has been set. As illustrated in FIG. 5A and FIG. 5B, the encapsulation tape/lead frame 500 includes the lead frame 10C used in Embodiment 3 above and the encapsulation tape 15 used in Embodiment 1 above. The encapsulation tape 15 is attached across the entirety of one surface (bottom surface) of the lead frame 10C that is opposite to the surface thereof holding the semiconductor chips 20. Thus, the encapsulation tape/lead frame 500 is not provided with any air-discharging structure as those provided in Embodiments 1 to 4 above.

Instead, as illustrated in FIG. 5A and FIG. 5B, the lower mold 52B of the present embodiment includes a plurality of U-shaped grooves 59 each extending from a position on the lower mold 52B corresponding to a position on the lead frame 10C inside the mold line 14 past another position on the lower mold 52B corresponding to the side edge 70 of the lead frame 10C. As illustrated in FIG. 5A, a semiconductor device is fabricated as in Embodiment 1 above by using the lower mold 52B of the present embodiment.

With the use of the lower mold 52B of the present embodiment including the U-shaped grooves 59, when the encapsulation resin 11 is injected into the cavity 53 in the resin encapsulation step, the air entrapped in the slight gap between the encapsulation tape 15 and the upper surface of the lower mold 52B is moved by the pressure from the encapsulation resin 11 toward the air vent 58, and is discharged out of the mold line 14 to the outside of the mold set through the grooves 59 before the lead frame 10C is deformed. Therefore, it is possible to prevent the lead frame 10C from being deformed, and to prevent a damage to the semiconductor chips 20, a deformation and disruption of the thin metal wires 21, etc., which may otherwise occur due to the deformation of the lead frame 10C.

Embodiment 6

Embodiment 6 of the present invention will now be described with reference to FIG. 6A and FIG. 6B.

Figure 6A:
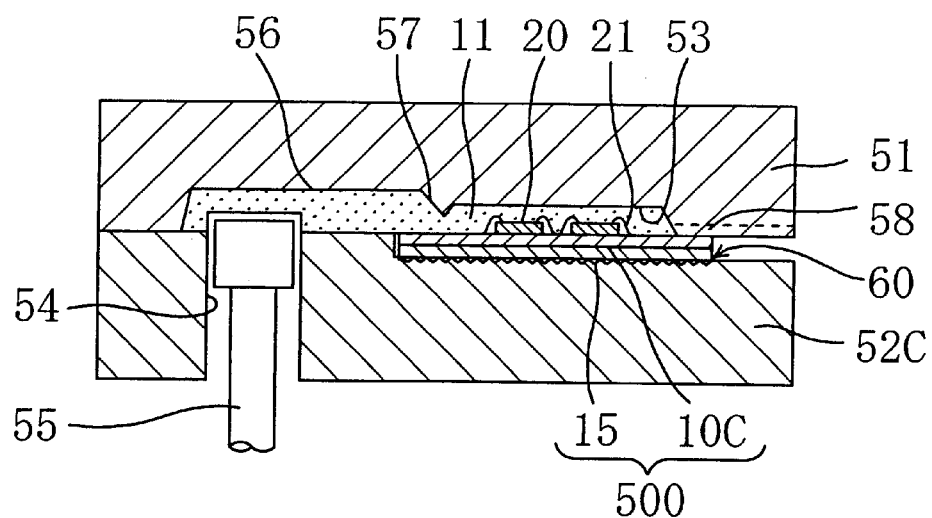
FIG. 6A is a cross-sectional view illustrating a method for fabricating a semiconductor device according to Embodiment 6 of the present invention.
Figure 6B:
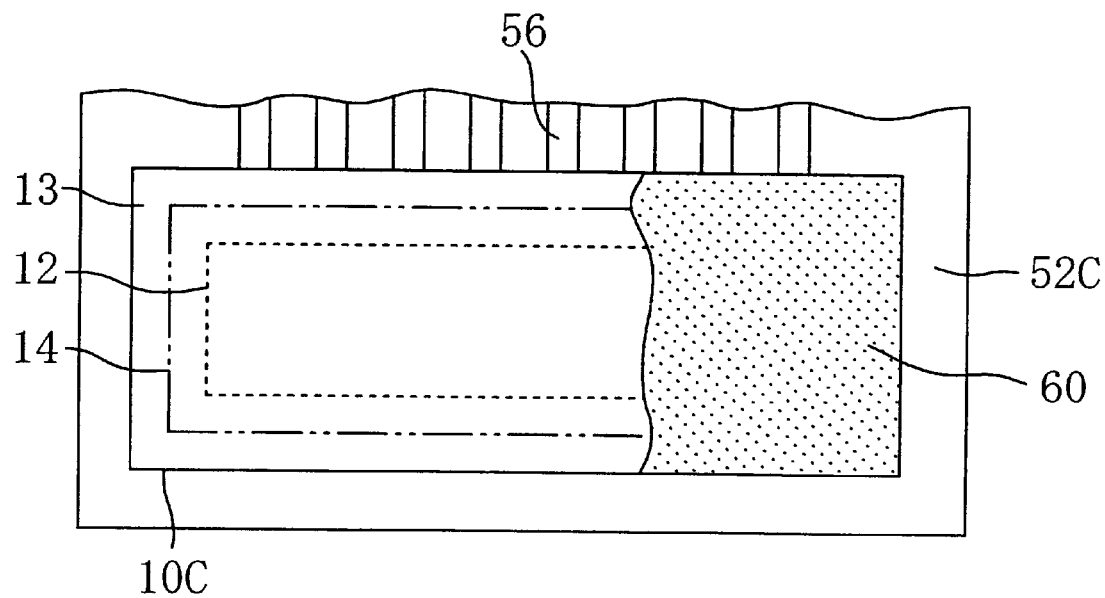
FIG. 6B is a diagram schematically illustrating an upper surface of a lower mold on which an encapsulation tape/lead frame has been set.
Figure 7A:
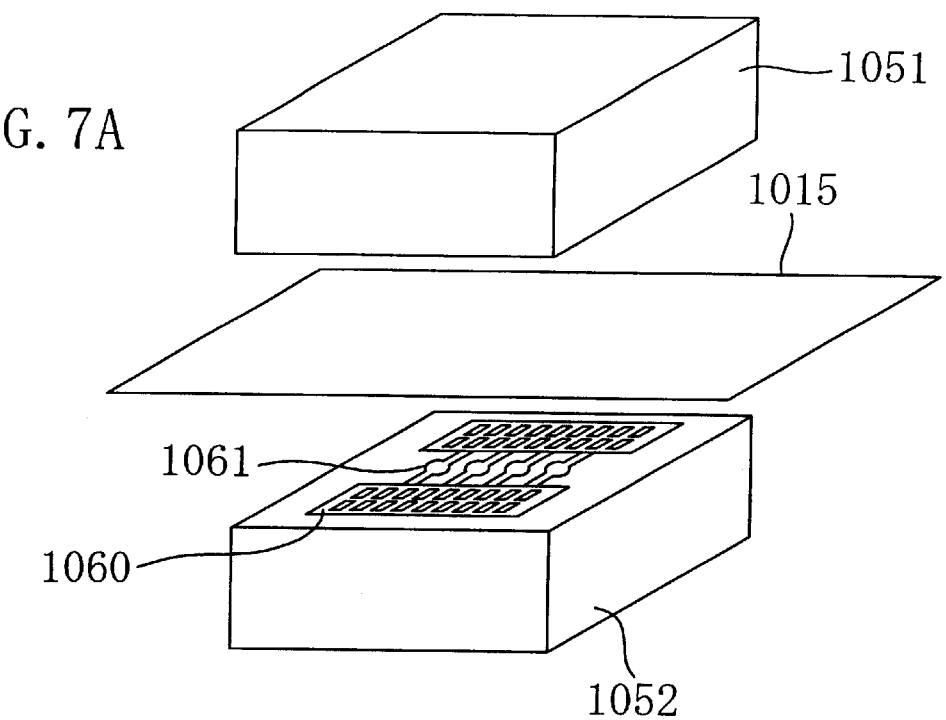
FIG. 7A to FIG. 7C are perspective views schematically illustrating a resin encapsulation apparatus used in a conventional molding method and a process of resin encapsulation with such an apparatus.
Figure 7B:
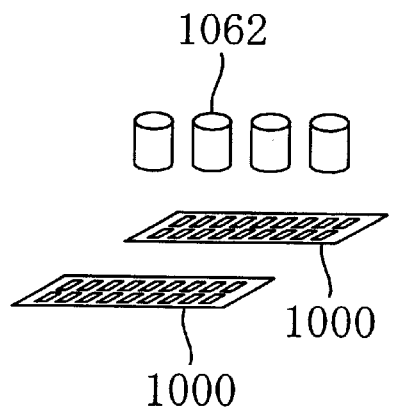
Figure 7C:
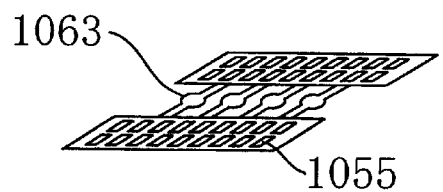
Figure 8A:
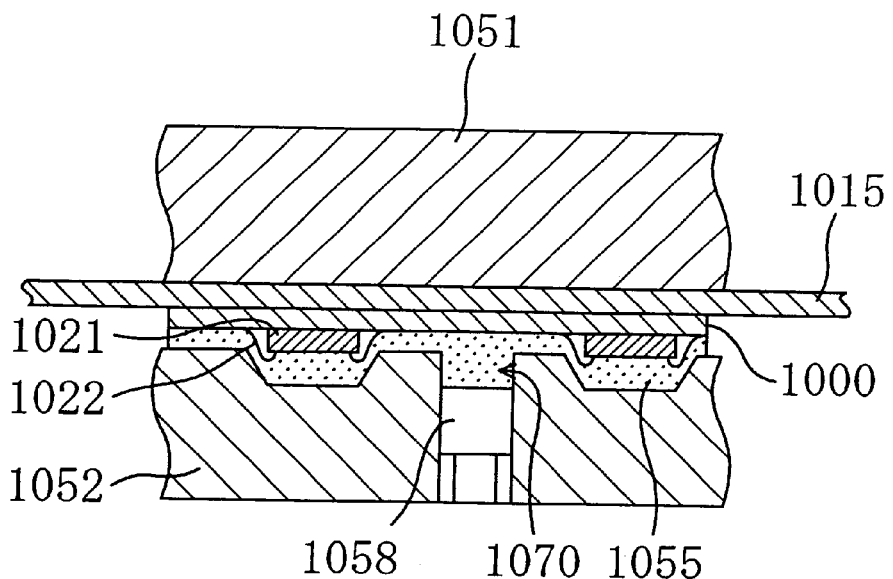
FIG. 8A and FIG. 8B are cross-sectional views illustrating the inside of an encapsulation mold set during the resin encapsulation process of the conventional molding method.
Figure 8B:
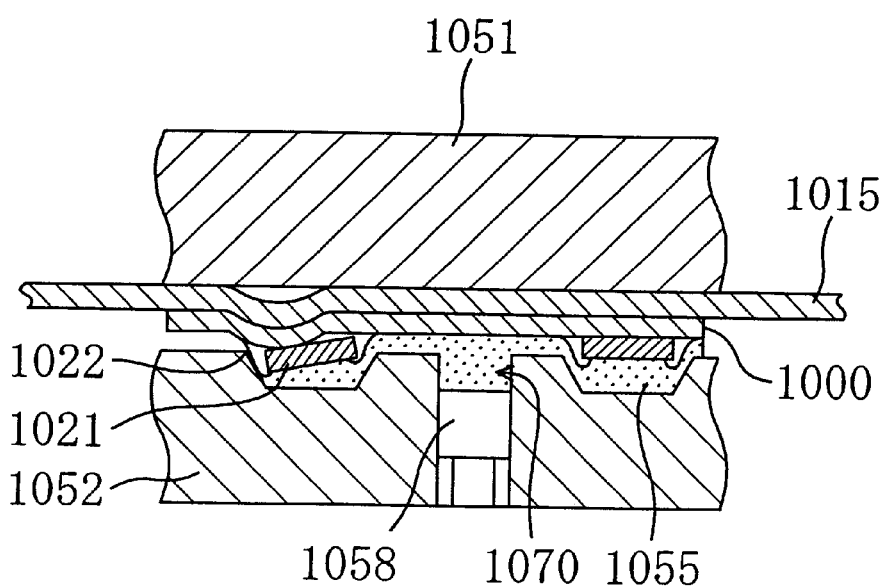

FIG. 6A is a cross-sectional view illustrating a method for fabricating a semiconductor device of the present embodiment, and FIG. 6B is a partially cutaway view schematically illustrating an upper surface of a lower mold 52C on which the encapsulation tape/lead frame 500 has been set. As illustrated in FIG. 6A and FIG. 6B, the encapsulation tape/lead frame 500 as that in Embodiment 5 above is used in the present embodiment.

As illustrated in FIG. 6A and FIG. 6B, the lower mold 52C of the present embodiment includes a rough surface (satin finished surface) 60 with minute surface irregularities in an area of the upper surface thereof that is to be in contact with the encapsulation tape 15. As illustrated in FIG. 6A, a semiconductor device is fabricated as in Embodiment 1 above by using the lower mold 52C of the present embodiment.

With the use of the lower mold 52C of the present embodiment including the satin finished surface 60, when the encapsulation resin 11 is injected into the cavity 53 in the resin encapsulation step, the air entrapped in the slight gap between the encapsulation tape 15 and the upper surface of the lower mold 52C is moved by the pressure from the encapsulation resin 11 toward the air vent 58 through spaces between the minute surface irregularities of the satin finished surface 60 of the lower mold 52C, and is discharged out of the mold line 14 to the outside of the mold set before the lead frame 10C is deformed. Therefore, it is possible to prevent the lead frame 10C from being deformed, and to prevent a damage to the semiconductor chips 20, a deformation and disruption of the thin metal wires 21, etc., which may otherwise occur due to the deformation of the lead frame 10C.

Particularly, this effect is pronounced when the surface roughness Rz of the satin finished surface 60 is in the range of 2 to 50 μm.

In the present embodiment, the rough surface (satin finished surface) 60 with minute surface irregularities is provided only in an area of the upper surface of the lower mold 52C that is to be in contact with the encapsulation tape 15. Alternatively, the entirety of the upper surface of the lower mold 52C may be satin finished. In any case, the effect described above can be obtained as long as at least an area of the upper surface of the lower mold 52C that is to be in contact with the encapsulation tape 15 is satin finished.

While Embodiments 1 to 6 have been described above as independent embodiments of the present invention, these embodiments may be combined with one another. For example, the encapsulation tape/lead frame 100 of Embodiment 1, the configuration of the lower mold of Embodiment 5, and the configuration of the lower mold of Embodiment 6 may be combined together. With an appropriate combination of the embodiments described above, the air entrapped between the adhesive tape and the lower mold can be discharged to the outside of the mold set more efficiently in the resin encapsulation step. Thus, it is possible to further improve the effect of suppressing/preventing the lead frame from being deformed in the resin encapsulation step and thus suppressing/preventing a damage to the semiconductor chips 20, a deformation and disruption of the thin metal wires 21, etc., which may otherwise occur due to the deformation of the lead frame.

What is claimed is:

1. A method for fabricating a resin-encapsulated semiconductor device, comprising the steps of:
   (a) preparing a lead frame, including:
      an upper surface;
      a bottom surface;
      a first region provided on the upper surface;
      a second region provided on the upper surface and surrounding the first region;
      a third region located outside the second region; and
      at least one groove formed on the bottom surface of the lead frame, the at least one groove extending from an area corresponding to the first region across another area corresponding to the second region so as to reach the third region;
   (b) providing a resin creepage preventing member on the area corresponding to the first region on the bottom surface;
   (c) mounting a semiconductor chip on the first region of the lead frame; and
   (d) clamping the second region by an encapsulation mold so as to place the semiconductor chip into a die cavity, and filling the die cavity with a resin,
      wherein in the step (d), the first region of the lead frame is provided within the die cavity, and the third region of the lead frame is exposed to an ambient air with the die cavity being filled with the encapsulation resin.

2. The method for fabricating a resin-encapsulated semiconductor device of claim 1, wherein in the step (a):
   the at least one groove is a U-shaped groove; and
   the third region is a side edge surrounding the second region.

3. The method for fabricating a resin-encapsulated semiconductor device of claim 1, wherein in the step (a), the at least one groove is a U-shaped groove that includes a through hole connecting the at least one groove to the third region.

4. The method for fabricating a resin-encapsulated semiconductor device of claim 1, wherein in the step (b), the resin creepage preventing member is provided along a surface of the at least one groove.

5. A method for fabricating a resin-encapsulated semiconductor device, comprising the steps of:
   (a) preparing a lead frame including an upper surface, a bottom surface, a first region provided on the upper surface, and a second region provided on the upper surface and surrounding the first region;
   (b) providing a resin creepage preventing member on an area corresponding to the first region on the bottom surface of the lead frame and another area corresponding to the second region on the bottom surface of the lead frame;
   (c) mounting a semiconductor chip on the first region of the lead frame; and
   (d) clamping the second region by an encapsulation mold that includes a die cavity so as to place the semiconductor chip into the die cavity, and filling the die cavity with a resin,
      wherein resin creepage preventing member includes at least one U-shaped groove,
      wherein in the step (b), the at least one U-shaped groove extends from a position corresponding to the first region on the bottom surface of the lead frame across the area corresponding to the second region on the bottom surface of the lead frame, so as to reach a flat surface including a side edge surrounding the second region of the lead frame, and wherein in the step (d), the first region of the lead frame is provided within the die cavity, and the side edge of the lead frame is exposed to an ambient air with the die cavity being filled with the encapsulation resin.

6. A method for fabricating a resin-encapsulated semiconductor device, comprising the steps of:

(a) preparing a first encapsulation mold including a die cavity and a clamp section and a second encapsulation mold including a surface corresponding to the die cavity and another surface corresponding to the clamp section, the second encapsulation mold including at least one groove extending from an area corresponding to the die cavity across another area corresponding to the clamp section so as to reach still another area surrounding the area corresponding to the clamp section;

(b) preparing a lead frame including an upper surface, a bottom surface, a first region provided on the upper surface, and a second region provided on the upper surface and surrounding the first region;

(c) providing a resin creepage preventing member on an area corresponding to the first region on the bottom surface of the lead frame and another area corresponding to the second region on the bottom surface of the lead frame;

(d) mounting a semiconductor chip on the first region of the lead frame; and (e) clamping the second region by the first encapsulation mold and the second encapsulation mold so as to place the semiconductor chip into the die cavity, and filling the die cavity with a resin.

* * * * *

UNITED STATES PATENT AND TRADEMARK OFFICE
CERTIFICATE OF CORRECTION

PATENT NO. : 6,645,792 B1
DATED : November 11, 2003
INVENTOR(S) : Akira Oga et al.

It is certified that error appears in the above-identified patent and that said Letters Patent is hereby corrected as shown below:

<u>Title page,</u>
Item [75], Inventors, delete "Akira Oga, Otsu (JP); Hisaho Inao, Arai (JP); Hiroshi Hidaka, Moriguchi (JP);" and insert -- Akira Oga, Shiga (JP); Hisaho Inao, Niigata (JP); Hiroshi Hidaka, Osaka (JP); --;

Signed and Sealed this

Eighteenth Day of May, 2004

JON W. DUDAS
*Acting Director of the United States Patent and Trademark Office*